(12) United States Patent
Kang

(10) Patent No.: US 12,205,268 B2
(45) Date of Patent: Jan. 21, 2025

(54) RECESSED STRUCTURE CAPABLE OF BEING CONVENIENTLY MONITORED ONLINE AND PREPARATION METHOD THEREOF

(71) Applicant: SHANGHAI IC R&D CENTER CO., LTD., Shanghai (CN)

(72) Inventor: Xiaoxu Kang, Shanghai (CN)

(73) Assignee: SHANGHAI IC R&D CENTER CO., LTD., Shanghai (CN)

( * ) Notice: Subject to any disclaimer, the term of this patent is extended or adjusted under 35 U.S.C. 154(b) by 517 days.

(21) Appl. No.: 17/762,714

(22) PCT Filed: Dec. 4, 2019

(86) PCT No.: PCT/CN2019/122972
§ 371 (c)(1),
(2) Date: Mar. 22, 2022

(87) PCT Pub. No.: WO2021/068388
PCT Pub. Date: Apr. 15, 2021

(65) Prior Publication Data
US 2022/0343490 A1    Oct. 27, 2022

(30) Foreign Application Priority Data

Oct. 8, 2019 (CN) .......................... 201910948614.5

(51) Int. Cl.
*G06T 7/00* (2017.01)
*H01L 21/66* (2006.01)

(52) U.S. Cl.
CPC ............ *G06T 7/0004* (2013.01); *H01L 22/12* (2013.01); *H01L 22/24* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 2008/0169477 | A1* | 7/2008 | Wang | H01L 27/14618 257/E27.12 |
| 2012/0211891 | A1* | 8/2012 | Vogl | H01L 23/481 257/773 |
| 2019/0393257 | A1* | 12/2019 | Gambino | H01L 23/481 |

* cited by examiner

*Primary Examiner* — Khaja Ahmad
(74) *Attorney, Agent, or Firm* — Bayramoglu Law Offices LLC

(57) ABSTRACT

The present invention disclosures a recessed structure capable of being conveniently monitored online, wherein comprising a dielectric layer I, and a dielectric layer II positioned above the dielectric layer I, the dielectric layer I comprises a metal via layer and a metal contact layer, the metal contact layer is positioned above the metal via layer; the dielectric layer II comprises an inverted trapezoid groove positioned above the metal contact layer, the inverted trapezoid groove has inclined sidewall, and the horizontal cross-sectional area of the inverted trapezoid groove far away from the metal contact layer is larger than the horizontal cross-sectional area of the inverted trapezoid groove close to the metal contact layer; the inclined sidewall is covered with a reflective film. The present invention provided the recessed structure capable of being conveniently monitored online and a preparation method thereof, by an alternating bright and dark annular image formed by a monitoring system, it can quickly identify defects in the recessed structure.

12 Claims, 2 Drawing Sheets

RECESSED STRUCTURE CAPABLE OF BEING CONVENIENTLY MONITORED ONLINE AND PREPARATION METHOD THEREOF

CROSS-REFERENCE TO RELATED APPLICATION

This application claims priority of International Patent Application Serial No. PCT/CN2019/122972, filed Dec. 4, 2019, which is related to and claims priority of Chinese Patent Application Serial No. CN201910948614.5, filed Oct. 8, 2019. The entirety of each of the above-mentioned patent applications is hereby incorporated herein by reference and made a part of this specification.

TECHNICAL FIELD

The disclosure relates to the technical field of recessed structures, in particular to a recessed structure capable of being conveniently monitored online and a preparation method thereof.

BACKGROUND

The reason why modern CMOS mass production technology can be run with low cost, high performance and high yield is introducing online process monitoring during production processes, through optical inspection or SEM and other means, real-time online monitoring of defects, particles, pattern dimension and other problems is performed, which is used to find out a problem in time and adopt a corresponding simple method to solve the problem, thus avoiding finding the problem after the product is completely taped out. When the product is completely taped out, and a whole process is completed, thus its scrap cost is relatively high.

In a process of preparing a recessed structure (such as a contact hole, a contact trench, etc.), sidewall of a traditional supporting and electrical connecting hole has a straighter etched shape. Since the hole is formed by etching a sacrificial layer, the depth of the hole is deep, a light inside the recessed structure is difficult to reflect outside, thus usually the sidewall of the hole presents a black image during the optical inspection. Because the sidewall is relatively straight, step coverage of a film on the sidewall is low, and parasitic resistance of the film is high, which can affect overall performances of a product. Therefore, from a perspective of product performances, it is hoped that the morphology of the recessed structure can be improved, so as to be online monitored easily in time.

SUMMARY

The purpose of the present invention is to provide a recessed structure capable of being conveniently monitored online and a preparation method thereof. By forming inclined sidewall in the recessed structure, when the recessed structure is monitored online, an incident light hits the recessed structure, and a monitoring system collects a reflected light or a scattered light from the recessed structure to form an imaging pattern; wherein, in the imaging pattern, a bright reflective outer ring is formed correspondingly by the reflective film covered the upper part of the inclined sidewall, a dark central ring is formed correspondingly by the reflective film covered the lower part of the inclined sidewall which cannot reflect or scatter the incident light out from the recessed structure, and a bright reflective region is formed correspondingly by the metal contact layer. By means of alternating bright and dark annular image, it is convenient to monitor the recessed structure online.

In order to achieve the above objective, the present invention adopts the following technical solution: a recessed structure capable of being conveniently monitored online, wherein comprising a dielectric layer I, and a dielectric layer II above the dielectric layer I, the dielectric layer I comprises a metal via layer and a metal contact layer, the metal contact layer is positioned above the metal via layer; the dielectric layer II comprises an inverted trapezoid groove positioned above the metal contact layer, the inverted trapezoid groove has inclined sidewall, and the horizontal cross-sectional area of the inverted trapezoid groove far away from the metal contact layer is larger than the horizontal cross-sectional area of the inverted trapezoid groove close to the metal contact layer; the inclined sidewall is covered with a reflective film; when the recessed structure is monitored online, an incident light hits the recessed structure, and a monitoring system collects a reflected light or a scattered light from the recessed structure to form an imaging pattern; wherein, in the imaging pattern, a bright reflective outer ring is formed correspondingly by the reflective film covered the upper part of the inclined sidewall, a dark central ring is formed correspondingly by the reflective film covered the lower part of the inclined sidewall which cannot reflect or scatter the incident light out from the recessed structure, and a bright reflective region is formed correspondingly by the metal contact layer.

Further, the reflective film covers the edge of the metal contact layer, the dark central ring is formed correspondingly by the reflective film covered the edge of the metal contact layer, and the lower part of the inclined sidewall which cannot reflect or scatter the incident light out from the recessed structure.

Further, an isolation medium layer is further comprised between the dielectric layer I and the dielectric layer II, the reflective film and the isolation medium layer cover the edge of the metal contact layer sequentially, the dark central ring is formed correspondingly by the reflective film and the isolation medium layer covered the edge of the metal contact layer, and the lower part of the inclined sidewall which cannot reflect or scatter the incident light out from the recessed structure.

Further, the reflectivity ability or scattering ability of the dielectric layer II to the incident light is less than the reflectivity ability or scattering ability of the reflective film to the incident light, in the imaging pattern, a dark outer ring is formed correspondingly by the dielectric layer II outside of the inclined sidewall.

Further, the width of the dark outer ring is greater than 0.2 micrometers.

Further, the metal contact layer and the metal via layer are separated by a connecting film.

Further, the angle between the inclined sidewall and the dielectric layer I is less than 75°.

Further, the reflective film comprises a silicon film or a germanium film or a silicon germanium film.

Further, the width of the dark middle ring is greater than 0.2 micrometers.

A method for preparing a recessed structure capable of being conveniently monitored online, wherein comprising: S01: forming a metal via layer and a metal contact layer sequentially from bottom to top in the dielectric layer I; S02: depositing a dielectric layer II on the upper surface of the dielectric layer I; S03: etching the dielectric layer II to form an inverted trapezoid groove positioned above the metal contact layer, the inverted trapezoid groove has inclined sidewall, and the horizontal cross-sectional area of the inverted trapezoid groove far away from the metal contact layer is larger than the horizontal cross-sectional area of the inverted trapezoid groove close to the metal contact layer; S04: depositing a reflective film on the inclined sidewall and the bottom surface of the inverted trapezoid groove; S05: etching the reflective film on the bottom surface of the inverted trapezoid groove to form an inverted trapezoid groove above the metal contact layer, so as to form a recessed structure.

Further, in S02, depositing an isolation medium layer and the dielectric layer II sequentially on the upper surface of the dielectric layer I; in S03, etching the dielectric layer II and stopping at the isolation medium layer to form the inverted trapezoid groove positioned above the metal contact layer; in S05, etching the reflective film and the isolation medium layer on the bottom surface of the inverted trapezoid groove to form the inverted trapezoid groove above the metal contact layer, so as to form the recessed structure.

Further, in S05, etching the reflective film and the isolation medium layer on the bottom surface of the inverted trapezoid groove to form the inverted trapezoid groove above the metal contact layer.

The beneficial effects of the present invention are: the inclined sidewall of the recessed structure is set to have a large inclination angle. When the recessed structure is monitored online, the incident light hits the recessed structure, and the monitoring system collects the reflected light or the scattered light from the recessed structure to form the imaging pattern; wherein, in the imaging pattern, the bright reflective outer ring is formed correspondingly by the reflective film covered the upper part of the inclined sidewall, the dark central ring is formed correspondingly by the reflective film covered the lower part of the inclined sidewall which cannot reflect or scatter the incident light out from the recessed structure, and the bright reflective region is formed correspondingly by the metal contact layer, by means of alternating bright and dark annular image, it is convenient to monitor the recessed structure online. Meanwhile, the recessed structure of the present invention is convenient to detect the inclination angle of the inclined sidewall, because in the imaging pattern, the width of the dark central ring corresponds to the reflective film covered the lower part of the inclined sidewall which cannot reflect or scatter the incident light out from the recessed structure, that is, the width of the dark central ring partly reflects the inclination angle of the inclined sidewall. The present invention adopts a symmetrical structure design, two recessed structures are set closely to form a group of recessed structures, thus it's possible to detect process problems more easily by optical inspection; the present invention integrates online monitoring and structural design, which can improve yield of related MEMS products greatly.

DETAILED DESCRIPTION

In order to make the objectives, technical solutions and advantages of the present invention clearer, the specific embodiments of the present invention will be further described in detail below in conjunction with the accompanying drawings.

The core idea of the present invention is setting a recessed structure to have inclined sidewall, and combining with characteristics of a reflective film on the inclined sidewall, an alternating bright and dark annular image can be formed in a monitoring image of a contact hole, which is convenient for online monitoring, thus defects in the recessed structure can be quickly find out and corrected in time.

Figure 1:
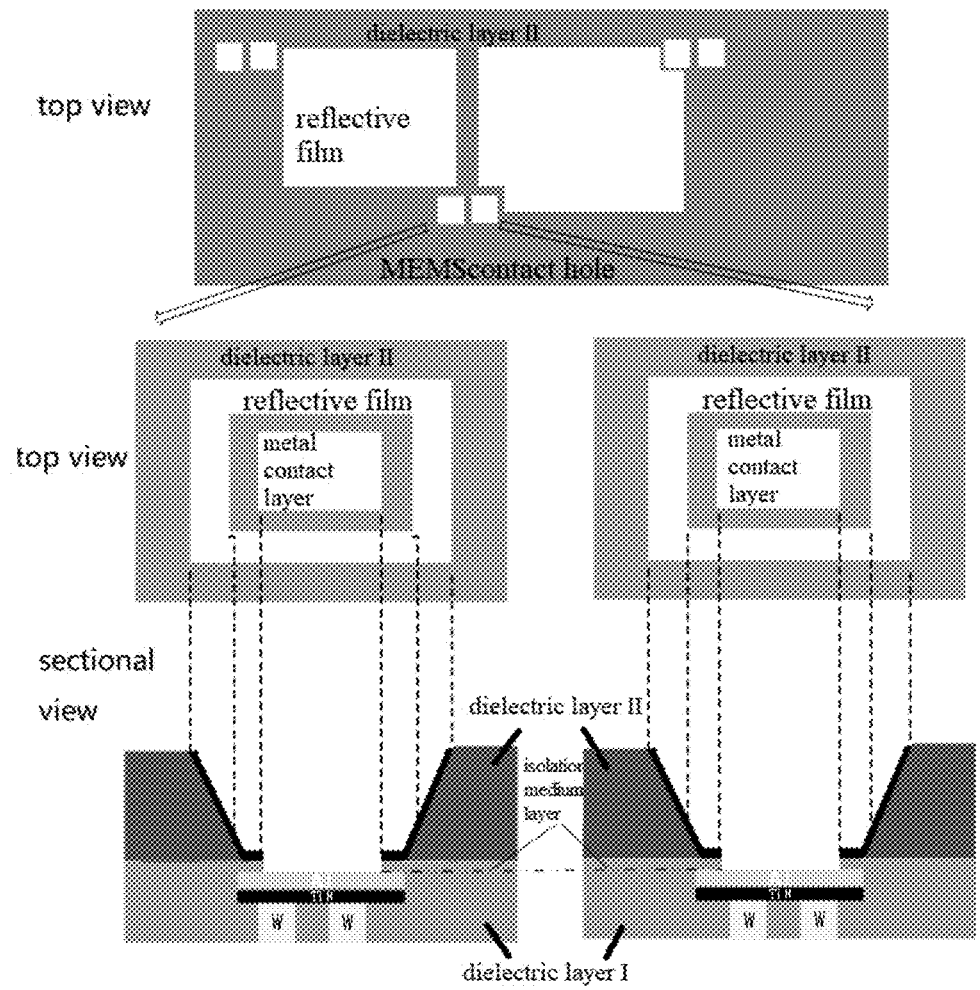
FIG. 1 is a schematic diagram of a recessed structure of the present invention.

As shown in FIG. 1, the present invention provides a recessed structure capable of being conveniently monitored online, which comprises a dielectric layer I, and a dielectric layer II above the dielectric layer I, the dielectric layer I comprises a metal via layer and a metal contact layer, the metal contact layer is positioned above the metal via layer; the dielectric layer II comprises an inverted trapezoid groove positioned above the metal contact layer, the inverted trapezoid groove has inclined sidewall, and the horizontal cross-sectional area of the inverted trapezoid groove far away from the metal contact layer is larger than the horizontal cross-sectional area of the inverted trapezoid groove close to the metal contact layer; the inclined sidewall is covered with a reflective film.

Preferably, in the present invention, an isolation medium layer is further comprised between the dielectric layer I and the dielectric layer II, the reflective film and the isolation medium layer cover the edge of the metal contact layer sequentially, that is, a step is formed on the edge of the metal contact layer, and the edge of the metal contact layer is surrounded by the reflective film and isolation medium layer that are higher than the surface of the metal contact layer, so as to reduce the parasitic resistance and improve the overall performances of the recessed structure. The metal contact layer and the metal via layer are separated by a connecting film, specifically, the connecting film comprises one of titanium nitride, titanium nitride, metals such as tantalum, titanium, cobalt, metal nitrides and metal alloys. Preferably, the angle between the inclined sidewall and the dielectric layer I is less than 75°; preferably, the reflective film comprises a silicon film or a germanium film or a silicon germanium film; preferably, the metal reflective layer is aluminum. In the present invention, the dielectric layer II can be a sacrificial layer, which is removed after the recessed structure is formed. It is worth noting that the horizontal cross-sectional shape of the inverted trapezoid groove is a rectangle in FIG. 1, in an actual process, the horizontal cross-sectional shape of the inverted trapezoid groove can be other shapes, which can form the above-mentioned alternating bright and dark annular image in the present invention. In FIG. 1, the isolation medium layer is further comprised between the dielectric layer I and the dielectric layer II, which is just an example. The present invention can not comprise the isolation medium layer, and the dielectric layer II is deposited directly on the dielectric layer I, thus the dielectric Layer II is deposited directly on the metal contact layer.

In the present invention, the dielectric layer I is composed of multiple diametrical layers, for example, an interlayer dielectric layer around a metal via layer, an intermetallic dielectric around the metal contact layer, etc. In a specific structure, it can also comprise other diametrical layers.

Figure 2:
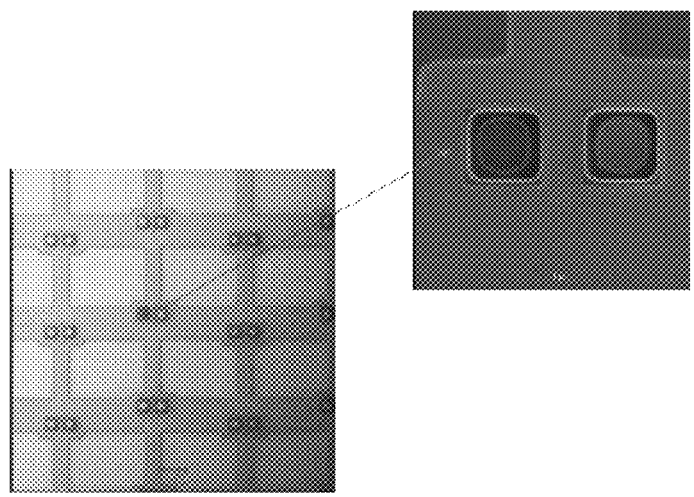
FIG. 2 is an SEM schematic diagram of a recessed structure of the present invention.

As shown in FIG. 2, it is the imaging pattern of the recessed structure of the present invention in a monitoring system. In the present invention, the reflectivity/scattering ability of the dielectric layer II to the incident light is less than the reflectivity/scattering ability of the reflective film to the incident light, when the recessed structure is monitored online, an incident light hits the recessed structure, and a monitoring system collects a reflected light or a scattered light from the recessed structure to form an imaging pattern; wherein, in the imaging pattern, a bright reflective outer ring is formed correspondingly by the reflective film covered the upper part of the inclined sidewall, which is parts of the inclined sidewall can reflect or scatter the incident light during the imaging process; the reflective film covers the edge of the metal contact layer, the dark central ring is formed correspondingly by the reflective film covered the edge of the metal contact layer, and the lower part of the inclined sidewall which cannot reflect or scatter the incident light out from the recessed structure, and a bright reflective region is formed correspondingly by the metal contact layer. The material of the metal contact layer is metal, which has a better reflectivity ability or scattering ability to the incident light, and compared with the reflective film covered the lower part of the inclined sidewall which cannot reflect or scatter the incident light out from the recessed structure, the metal contact layer in the imaging pattern must be brightly. In addition, in the present invention, the reflectivity ability or scattering ability of the dielectric layer II to the incident light is less than the reflectivity ability or scattering ability of the reflective film to the incident light, the dielectric layer II outside of the inclined sidewall correspondingly forms a dark outer ring in the imaging pattern. the dark outer ring is positioned outside of the bright reflective outer ring (the reflective film above the inclined sidewall is formed correspondingly in the imaging pattern); when the dielectric layer II is removed as the sacrificial layer, the outer periphery of the inverted trapezoid groove is the dielectric layer I. The scattering ability of the dielectric layer I to incident light is also less than the scattering ability of the reflective film to incident light, then the dielectric layer I outside the inclined sidewall forms a dark outer ring in the imaging pattern. That is, there must be a ring-shaped dark outer ring (formed by the dielectric layer I or the dielectric layer II in the imaging pattern) outside the bright reflective outer ring. By means of alternating bright and dark annular image, it is convenient to monitor the recessed structure online.

Wherein, as shown in FIG. 1, the dielectric layer outside the reflective film in the recessed structure forms the dark outer ring in the imaging pattern; the bright reflective outer ring in the imaging pattern is the reflective film covered the inclined sidewall that can reflect or scatter the incident light, for the inverted trapezoid groove is deep, the reflective film covered the upper part of the inclined sidewall can reflect or scatter the incident light to the online monitoring system for receiving, while the light reflected or scattered by the reflective film the dielectric layer I which are covered the lower part of the inclined sidewall and at the edge of the contact metal layer cannot be emitted outside of the recessed structure and cannot be received by the online monitoring system. Meanwhile, the reflective film covered the upper part of the inclined sidewall forms the bright reflective outer ring, and the reflective film covered the lower part of the inclined sidewall which cannot reflect or scatter the incident light out from the recessed structure correspondingly forms the dark central ring in the imaging pattern. The metal contact layer positioned inner side has a better reflection and scattering performance, so it will form the bright reflection region on the inner side; the structure of the alternating bright and dark annular image can enhance image recognition and contrast, that is, it can quickly and accurately identify defects of the recessed structures. It is worth noting that the recessed structure of the present invention combined with the online monitoring system can be used to monitor the inclination angle of the inclined sidewall in the recessed structure. In the present invention, the height of the inclined sidewall is fixed, meanwhile, the width of the dark central ring in the imaging pattern is corresponding to the reflective film covers the edge of the metal contact layer and the reflective film covered the lower part of the inclined sidewall which cannot reflect or scatter the incident light out from the recessed structure, the angle between the inclined sidewall and the dielectric layer I becomes smaller, the incident light which can be incident into the inverted trapezoid groove increases, then the width of the dark central ring in the imaging pattern becomes smaller; thus the inclination angle of the inclined sidewall can be monitored according to the width of the dark central ring in the imaging pattern.

Preferably, the vertical height of the inclined sidewall of the inverted trapezoid groove in the present invention is generally 1-5 microns, by adjusting the angle between the inclined sidewall and the dielectric layer I and the depth of the inverted trapezoid groove, the width of the dark central ring in the imaging pattern is corresponding to the reflective film covered the lower part of the inclined sidewall which cannot reflect or scatter the incident light out from the recessed structure is greater than 0.2 microns. The width here refers to a projection width on a horizontal plane. Meanwhile, the width of the dielectric layer area outside the inverted trapezoid groove (a shortest distance between the outer boundary of the inverted trapezoid groove and the surrounding reflective film in FIG. 1), that is, the width of the dark outer ring is greater than 0.2 microns, which is convenient for contrasting light and dark stripes.

Please continue to refer to FIG. 1. The recessed structures in the present invention are arranged adjacent to each other as a group. When online monitoring is performed, a monitoring equipment such as optical inspection or SEM is usually used to image the recessed structures. In the present invention, the field of the monitoring equipment can be adjusted to display 10 repeating units, and then defects in the recessed structure are identified through the optical image comparison between each group of recessed structures and multiple groups of recessed structures.

In an online monitoring process, the monitoring system can adopt the reflected light or scattered light of the incident light on the recessed structure to image, and confirm whether there are defects in the recessed structure by analyzing and comparing the imaging patterns. If the reflected light or scattered light of the recessed structure is too strong, the final imaged pattern will be bright and white, and details in the recessed structure cannot be clearly obtained. Since the reflected light of the metal contact layer and the reflective film is relatively strong, in order to prevent excessive reflection, the scattered light of the incident light after being scattered on the recessed structure can be used for image monitoring. When the reflective film is an amorphous silicon film, the present invention can also reduce the density of the amorphous silicon film, so as to prevent the amorphous silicon film from reflecting or scattering too strong, and allow better image contrast and monitoring.

The present invention also provides a method for preparing a recessed structure capable of being conveniently monitored online, which includes following steps:

S01: forming a metal via layer and a metal contact layer sequentially from bottom to top in the dielectric layer I, wherein, the dielectric layer I comprises an interlayer dielectric layer and an intermetal dielectric layer from bottom to top, the metal via layer is positioned in the interlayer dielectric layer, the metal contact layer is positioned in the intermetallic medium layer; the material of the metal via layer is tungsten, the material of the metal contact layer is Al, the metal via layer and the metal contact layer are separated by a connecting film.

S02: depositing a dielectric layer II on the upper surface of the dielectric layer I. Preferably, an isolation medium layer and a dielectric layer II are deposited on the upper surface of the dielectric layer I.

S03: etching the dielectric layer II to form an inverted trapezoid groove positioned above the metal contact layer, the inverted trapezoid groove has inclined sidewall, and the horizontal cross-sectional area of the inverted trapezoid groove far away from the metal contact layer is larger than the horizontal cross-sectional area of the inverted trapezoid groove close to the metal contact layer. Preferably, when the isolation medium layer is deposited on the upper surface of the dielectric layer I, the etching of the inverted trapezoid groove in this step stops at the isolation medium layer.

A specific method for forming the inverted trapezoid groove is: coating and patterning photo-resist on the dielectric layer II to form a patterned photo-resist layer, using the patterned photo-resist layer as a mask to etch the dielectric layer II; reducing the size of the patterned photo-resist layer by a plasma and other reaction gases, and then using the patterned photo-resist layer as the mask to etch the dielectric layer II, and so on, finally forming the inverted trapezoid groove, and then removing the patterned photo-resist layer.

S04: depositing a reflective film on the inclined sidewall and the bottom surface of the inverted trapezoid groove; the reflective film can be an amorphous silicon film with better reflective performance.

S05: etching the reflective film on the bottom surface of the inverted trapezoid groove to form the inverted trapezoid groove above the metal contact layer, so as to form the recessed structure. Preferably, when the isolation medium layer is deposited on the upper surface of the dielectric layer I, in S05, etching the reflective film and the isolation medium layer on the bottom surface of the inverted trapezoid groove to form the inverted trapezoid groove above the metal contact layer, so as to form the recessed structure. Preferably, etching the reflective film and the isolation medium layer on the bottom surface of the inverted trapezoid groove, and making the reflective film and the isolation medium layer cover the edge of the metal contact layer sequentially; that is, the step is formed on the edge of the metal contact layer, and the edge of the metal contact layer is surrounded by the reflective film and isolation medium layer that are higher than the surface of the metal contact layer.

In the present invention, the inclined sidewall with the large inclination angle is set on the recessed structure. when the recessed structure is monitored online, the incident light hits the recessed structure, and the monitoring system collects the reflected light or the scattered light from the recessed structure to form the imaging pattern; wherein, in the imaging pattern, the bright reflective outer ring is formed correspondingly by the reflective film covered the upper part of the inclined sidewall, the dark central ring is formed correspondingly by the reflective film covered the lower part of the inclined sidewall which cannot reflect or scatter the incident light out from the recessed structure, and the bright reflective region is formed correspondingly by the metal contact layer, by means of alternating bright and dark annular image, it is convenient to monitor the recessed structure online. Meanwhile, the recessed structure of the present invention is convenient to detect the inclination angle of the inclined sidewall, because in the imaging pattern, the width of the dark central ring corresponds to the reflective film covered the lower part of the inclined sidewall which cannot reflect or scatter the incident light out from the recessed structure, that is, the width of the dark central ring in some degree reflects the inclination angle of the inclined sidewall. The present invention adopts a symmetrical structure design, two recessed structures are set closely to form a group of recessed structures, thus it's possible to detect process problems more easily by optical inspection; the present invention integrates online monitoring and structural design, which can improve yield of related MEMS products greatly. In addition, the recessed structure of the present invention forms the step on the edge of the metal contact layer, and the edge of the metal contact layer is surrounded by the reflective film and isolation medium layer that are higher than the surface of the metal contact layer, so as to reduce the parasitic resistance of the recessed structure and improve overall performances of the recessed structure.

The above descriptions are only the preferred embodiments of the present invention, and the described embodiments are not used to limit the scope of patent protection of the present invention. Therefore, any equivalent structural changes made using the contents of the description and drawings of the present invention should be included in the same reasoning. Within the protection scope of the appended claims of the present invention.

What is claimed is:

1. A recessed structure capable of being conveniently monitored online, wherein comprising a dielectric layer I, and a dielectric layer II above the dielectric layer I, the dielectric layer I comprises a metal via layer and a metal contact layer, the metal contact layer is positioned above the metal via layer; the dielectric layer II comprises an inverted trapezoid groove positioned above the metal contact layer, the inverted trapezoid groove has inclined sidewall, and a horizontal cross-sectional area of the inverted trapezoid groove far away from the metal contact layer is larger than the horizontal cross-sectional area of the inverted trapezoid groove close to the metal contact layer; the inclined sidewall is covered with a reflective film;

when the recessed structure is monitored online, an incident light hits the recessed structure, and a monitoring system collects a reflected light or a scattered light from the recessed structure to form an imaging pattern; wherein, in the imaging pattern, a bright reflective outer ring is formed correspondingly by the reflective film covered an upper part of the inclined sidewall, a dark central ring is formed correspondingly by a reflective film covered a lower part of the inclined sidewall which cannot reflect or scatter the incident light out from the recessed structure, and a bright reflective region is formed correspondingly by the metal contact layer.

2. The recessed structure of claim 1, wherein, the reflective film covers the edge of the metal contact layer, the dark central ring is formed correspondingly by the reflective film covered the edge of the metal contact layer, and the lower part of the inclined sidewall which cannot reflect or scatter the incident light out from the recessed structure.

3. The recessed structure of claim 2, wherein, an isolation medium layer is further comprised between the dielectric layer I and the dielectric layer II, the reflective film and the isolation medium layer cover the edge of the metal contact layer sequentially, the dark central ring is formed correspondingly by the reflective film and the isolation medium layer covered the edge of the metal contact layer, and the lower part of the inclined sidewall which cannot reflect or scatter the incident light out from the recessed structure.

4. The recessed structure of claim 1, wherein, the reflectivity ability or scattering ability of the dielectric layer II to the incident light is less than the reflectivity ability or scattering ability of the reflective film to the incident light, in the imaging pattern, a dark outer ring is formed correspondingly by the dielectric layer II outside of the inclined sidewall.

5. The recessed structure of claim 4, wherein, the width of the dark outer ring is greater than 0.2 micrometers.

6. The recessed structure of claim 1, wherein, the metal contact layer and the metal via layer are separated by a connecting film.

7. The recessed structure of claim 1, wherein, the angle between the inclined sidewall and the dielectric layer I is less than 75°.

8. The recessed structure of claim 1, wherein, the reflective film comprises a silicon film or a germanium film or a silicon germanium film.

9. The recessed structure of claim 1, wherein, the width of the dark middle ring is greater than 0.2 micrometers.

10. A preparation method for a recessed structure capable of being conveniently monitored online, wherein comprising:
    S01: forming a metal via layer and a metal contact layer sequentially from bottom to top in a dielectric layer I;
    S02: depositing a dielectric layer II on the upper surface of the dielectric layer I;
    S03: etching the dielectric layer II to form an inverted trapezoid groove positioned above the metal contact layer, the inverted trapezoid groove has inclined sidewall, and a horizontal cross-sectional area of the inverted trapezoid groove far away from the metal contact layer is larger than the horizontal cross-sectional area of the inverted trapezoid groove close to the metal contact layer;
    S04: depositing a reflective film on the inclined sidewall and the bottom surface of the inverted trapezoid groove;
    S05: etching the reflective film on the bottom surface of the inverted trapezoid groove to form an inverted trapezoid groove above the metal contact layer, so as to form the recessed structure.

11. The preparation method of claim 10, wherein, in S02, depositing an isolation medium layer and the dielectric layer II sequentially on the upper surface of the dielectric layer I;
    in S03, etching the dielectric layer II and stopping at the isolation medium layer to form the inverted trapezoid groove positioned above the metal contact layer;
    in S05, etching the reflective film and the isolation medium layer on the bottom surface of the inverted trapezoid groove to form the inverted trapezoid groove above the metal contact layer.

12. The preparation method of claim 11, wherein, in S05, etching the reflective film and the isolation medium layer on the bottom surface of the inverted trapezoid groove, and making the reflective film and the isolation medium layer cover the edge of the metal contact layer sequentially.

* * * * *